(12) United States Patent
Somaschini et al.

(10) Patent No.: US 9,059,261 B2
(45) Date of Patent: *Jun. 16, 2015

(54) FORMING ARRAY CONTACTS IN SEMICONDUCTOR MEMORIES

(71) Applicant: Micron Technology, Inc., Boise, ID (US)

(72) Inventors: Roberto Somaschini, Vimercate (IT); Alessandro Vaccaro, Boise, ID (US); Paolo Tessariol, Montebelluna (IT); Giulio Albini, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/302,160

(22) Filed: Jun. 11, 2014

(65) Prior Publication Data

US 2014/0284812 A1    Sep. 25, 2014

Related U.S. Application Data

(60) Continuation of application No. 14/066,340, filed on Oct. 29, 2013, now Pat. No. 8,759,980, which is a division of application No. 12/724,491, filed on Mar. 16, 2010, now Pat. No. 8,569,891.

(51) Int. Cl.
H01L 21/768    (2006.01)
H01L 27/105    (2006.01)
H01L 23/522    (2006.01)
H01L 23/528    (2006.01)
H01L 27/115    (2006.01)

(52) U.S. Cl.
CPC ...... H01L 21/76895 (2013.01); H01L 27/1052 (2013.01); H01L 27/11521 (2013.01); H01L 23/5226 (2013.01); H01L 23/5283 (2013.01); H01L 21/76807 (2013.01); H01L 21/76816 (2013.01)

(58) Field of Classification Search
USPC .............................. 257/773, 775, 784, E23.01
See application file for complete search history.

(56) References Cited

U.S. PATENT DOCUMENTS

| 8,569,891 | B1 | 10/2013 | Somaschini et al. |
| 8,759,980 | B2 * | 6/2014 | Somaschini et al. .......... 257/773 |
| 2008/0026528 | A1 | 1/2008 | Yuan et al. |
| 2008/0026561 | A1 | 1/2008 | Hsu et al. |
| 2014/0048956 | A1 | 2/2014 | Somaschini et al. |

* cited by examiner

Primary Examiner — Roy Potter
(74) Attorney, Agent, or Firm — Dorsey & Whitney LLP

(57) ABSTRACT

Array contacts for semiconductor memories may be formed using a first set of parallel stripe masks and subsequently a second set of parallel stripe masks transverse to the first set. For example, one set of masks may be utilized to etch a dielectric layer, to form parallel spaced trenches. Then the trenches may be filled with a sacrificial material. That sacrificial material may then be masked transversely to its length and etched, for example. The resulting openings may be filled with a metal to form array contacts.

21 Claims, 4 Drawing Sheets

FORMING ARRAY CONTACTS IN SEMICONDUCTOR MEMORIES

CROSS-REFERENCE TO RELATED APPLICATIONS

This application is a continuation of U.S. patent application Ser. No. 14/066,340, filed on Oct. 29, 2013, which is as divisional of U.S. patent application Ser. No. 12/724,491 filed on Mar. 16, 2010, and issued as U.S. Pat. No. 8,569,891 on Oct. 29, 2013. These applications and patent are incorporated herein by reference, in their entirety, and for any purpose.

BACKGROUND

This relates generally to semiconductor memories, such as non-volatile memories or volatile memories. Particularly, it relates to forming array contacts in memories.

Semiconductor memories may be volatile or non-volatile memories. Examples of volatile memories include dynamic random access memories (DRAMs) and static random access memories (SRAMs). Examples of non-volatile memories include Flash memories and resistive random access memories (ReRAM), such as phase change memories, to mention a few examples.

Typically, semiconductor memories include an array made up of parallel conductive rows and parallel conductive columns perpendicular to the rows. Selectable memory cells are formed at the intersections of those rows and columns.

Array contacts electrically connect elements in the array to metallization lines overlying the array. The array contacts then are conductive vias. With increasingly smaller memory cell sizes, array contacts need to effectively scale correspondingly.

DETAILED DESCRIPTION

In accordance with some embodiments, array contacts can be formed without some of the limitations typically imposed by conventional lithographic techniques. For example, conventional array contacts for high density arrays may be made using a dipole illumination mode for lithographic contact hole definition. One problem with this technique is that the illumination mode results in an elliptical shape for the contact where the X/Y ratio is reduced with reducing critical pitch. Overly elliptical contacts can sometimes result in integration issues in terms of contact to gate distance.

In accordance with some embodiments of the present invention, at least perpendicular masks and definition stages are used to define the array contacts instead of using the single mask, dipole illumination mode technique. This may result, in some embodiments, in reducing the integration issues that sometimes arise from an overly elliptical contact shape.

Figure 1:
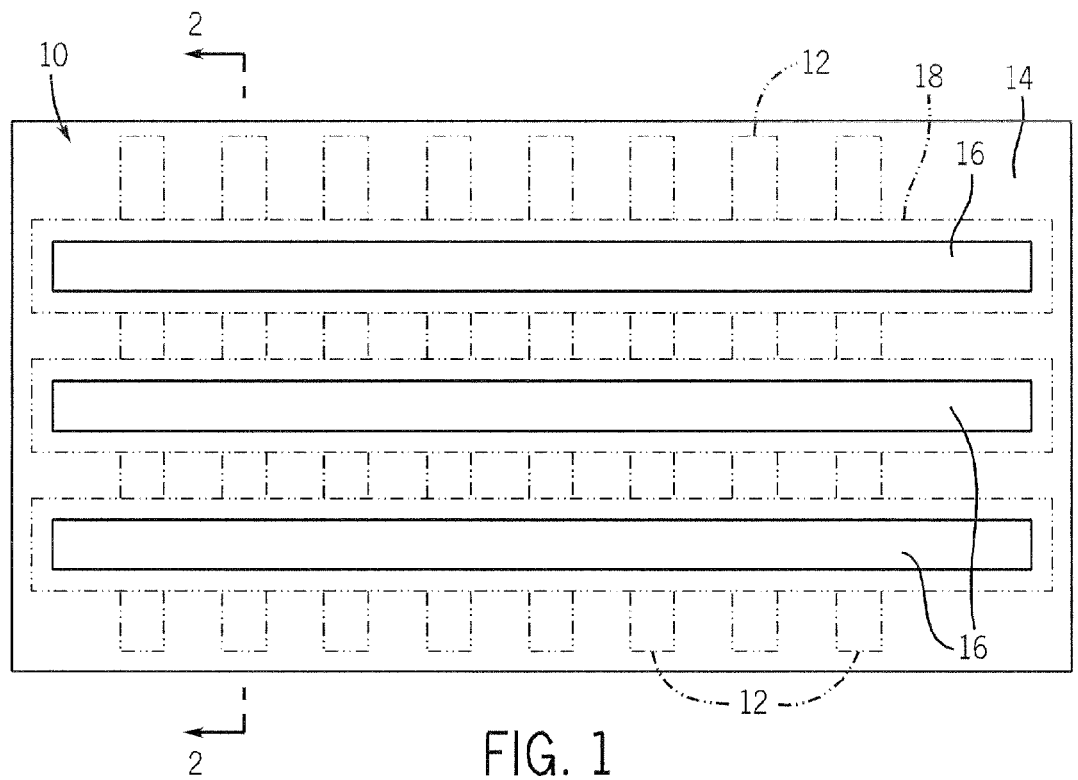
FIG. 1 is an enlarged, top plan view of one embodiment of the present invention at an early stage of manufacture.

Referring to FIG. 1, a memory array 10 may include a plurality of parallel, spaced conductive lines 16, extending generally perpendicularly to parallel, spaced active areas 12, situated below the lines 16. The active areas are the regions where the memory cells are formed. The regions surrounding the lines 16 may be filled with a dielectric 14, such as pre-metal deposition (PMD) oxide, over an etch stop layer (not shown) such as borderless nitride for example. However, other dielectrics may be used as well. The conductive lines 16 may, for example, be control gates, in a Flash memory embodiment. However, the present invention is applicable to any semiconductor memory technology, including volatile and non-volatile memories.

A plurality of spaced parallel masks 18 may be aligned over the conductive lines 16, each mask 18 having dimensions slightly larger than the conductive lines 16. Thus, the masks 18 may extend in the same direction as the conductive lines 16 and generally perpendicularly to the active areas 12 in one embodiment. The masks 18 may be patterned photoresist for example.

Figure 2:
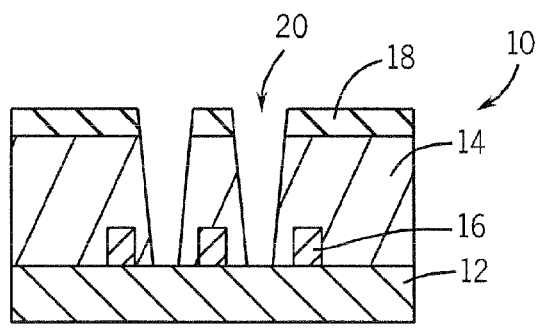
FIG. 2 is a reduced cross-sectional view taken generally along the line 2-2 in FIG. 1.

Referring to FIG. 2, the conductive lines 16 extend perpendicularly across the active areas 12. Other elements are not shown for simplicity. In this case 1 spaced, parallel tapered trenches 20 are formed between adjacent conductive lines 16. The trenches 20 extend in the same lengthwise direction and have the same pitch as the conductive lines 16 in this embodiment. The trenches 20 may be formed using the masks 18, shown in FIG. 1 with dry etching for example. The mask 18 widths may be altered by the etching process. The etching may stop on an etch stop layer (not shown) at the bottom of the dielectric 14. In some embodiments, the etching is highly selective of the etch stop.

After etching, the masks 18 may be removed. In some embodiments, the trenches 20 may taper inwardly from top to bottom as a result of the selected etching techniques. However, in other embodiments, vertical wall trenches may be formed.

Figure 3:
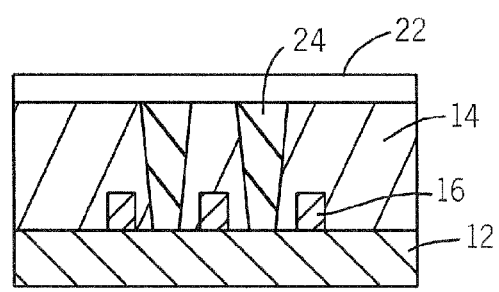
FIG. 3 is a cross sectional view corresponding to FIG. 2 at a subsequent stage in accordance with one embodiment.

Referring to FIG. 3, at this second masking stage, the trenches 20 may be filled with trench filler 24 and planarized to the height of the dielectric 14. Examples of trench filler materials include nitrides, such as SiON, polysilicon, etc. Parallel spaced masks 22, formed of any suitable material, including photoresist, may extend generally perpendicularly to the lengths of the filled trenches 24. The masks 22 may cover the region between the active areas 12, shown in FIG. 1. The width of the masks 22 determines the desired spacing between resulting, later termed array contacts, as well as the thicknesses of those array contacts. A dry etching process used with masks 22 may be very selective to the selected trench filler 24, in some embodiments.

Figure 4:
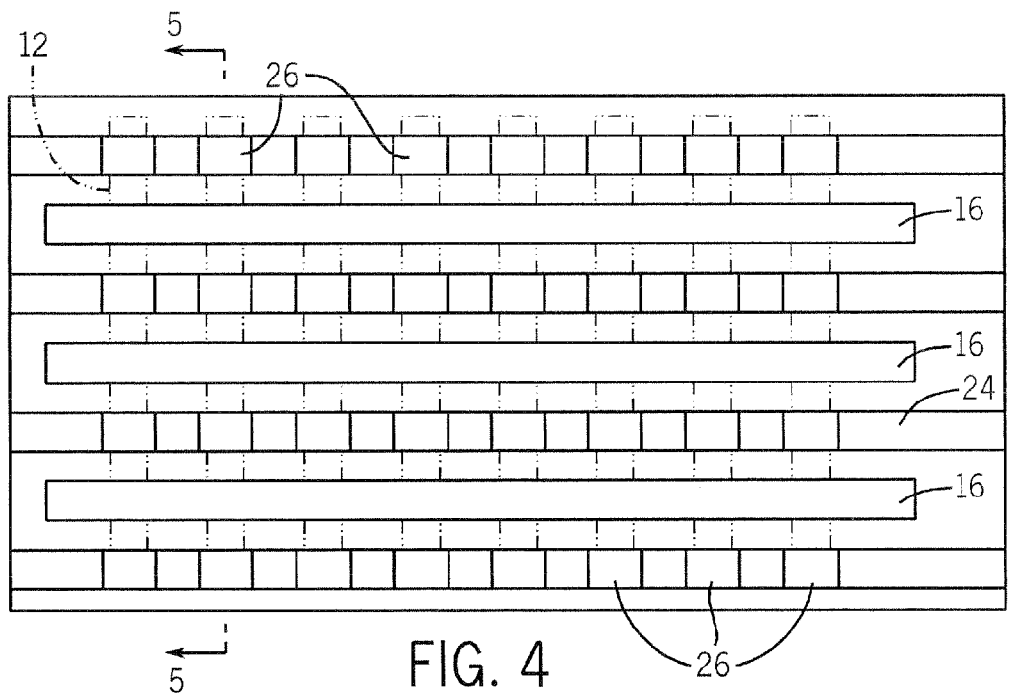
FIG. 4 is a top plan view at a subsequent stage in accordance with the embodiment of FIGS. 1-3.

Moving to FIG. 4, the filled trenches 24 extend generally parallel to the conductive lines 16 and may be situated between adjacent conductive lines. In the direction perpendicular to the trenches 24, the active areas 12 extend parallel to one another. An array contact 26 may be formed in the active areas at the intersection between a trench filler 24 and an active area 12. Other array contact pitches may so be used.

Figure 5:
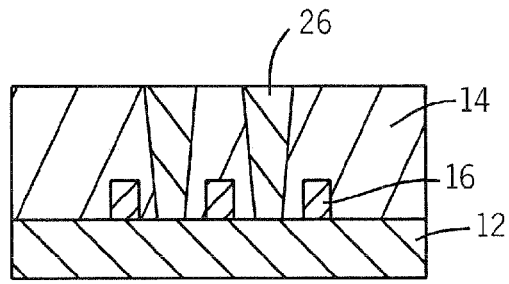
FIG. 5 is an enlarged, cross-sectional view taken generally along the line 5-5 in FIG. 4.

Thus, as shown in FIG. 5 1 the array contacts 26 are formed at the locations never covered by the masks 18 or 22 (which have been removed at this point). The masks 18 and 22 are arranged perpendicularly to one another. An etchant may be used with the mask 22, which etchant is highly selective of the pre-metal deposition oxide 14. As a result, only the trench filler 24 is removed. The masks 22 may then remove as well.

The resulting etched holes in the trench filler 24 may then filled by standard barrier layers and metal, such as tungsten. Then, a standard chemical mechanical planarization process may be utilized to form the array contacts 26, shown in FIG. 5. The array contacts 26 may be columnar with a square or rectangular cross-section. The array contacts may taper toward the semiconductor substrate. Thus, the contacts 26 may be high aspect ratio or elongate, truncated pyramids. In some cases, the resulting array contacts 26 are more circular or elliptical because the corners tend to etch away.

Figure 6:
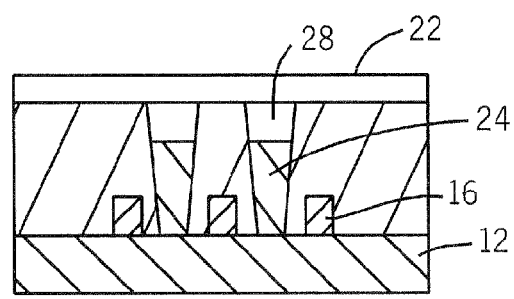
FIG. 6 is an enlarged, cross-sectional view of an alternate embodiment at a stage subsequent to the stage shown in FIG. 3 in accordance with one embodiment.

Referring to FIG. 6 1 in accordance with a dual damascene embodiment, in the same region used to form the array contacts 26, the fill trenches 24 are partially etched out, as indicated at 28. A dual damascene structure can be formed in the same vertical space that was used to form the array contacts 26 in FIG. 5 in some embodiments. This may be important, in some embodiments, because the amount of vertical space may be limited. However, in some embodiments, the etch out step may not be used. The etch out step entirely removes the upper portion of the trench filler 24, extending into the page in FIG. 6, and leaving a vertically shortened trench filler. A suitable wet etchant that selectively etches the trench filler 24 may be used in some embodiments.

Figure 7:
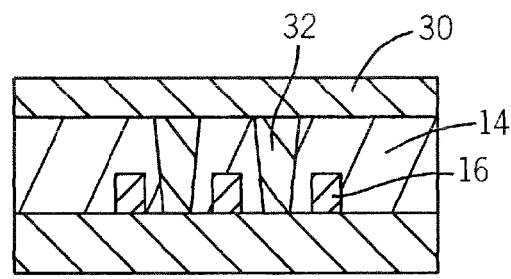
FIG. 7 is an enlarged, cross-sectional view at a subsequent stage to that shown in FIG. 6 in accordance with one embodiment.

Then, as shown FIG. 7, the remaining trench filler 24 may be removed at the intersections of masks as described previously, resulting in the array contacts 32. Where the upper layer of the trench filler 24 was removed, spaced parallel metal lines 30 may extend transversely to the conductive lines 16 and have array contacts 32 extend downwardly from the metal lines 30 between adjacent conductive lines 16. These metal lines may, for example, be used as row or bit lines. The metal lines 30 may be formed of the same or different materials.

Figure 8:
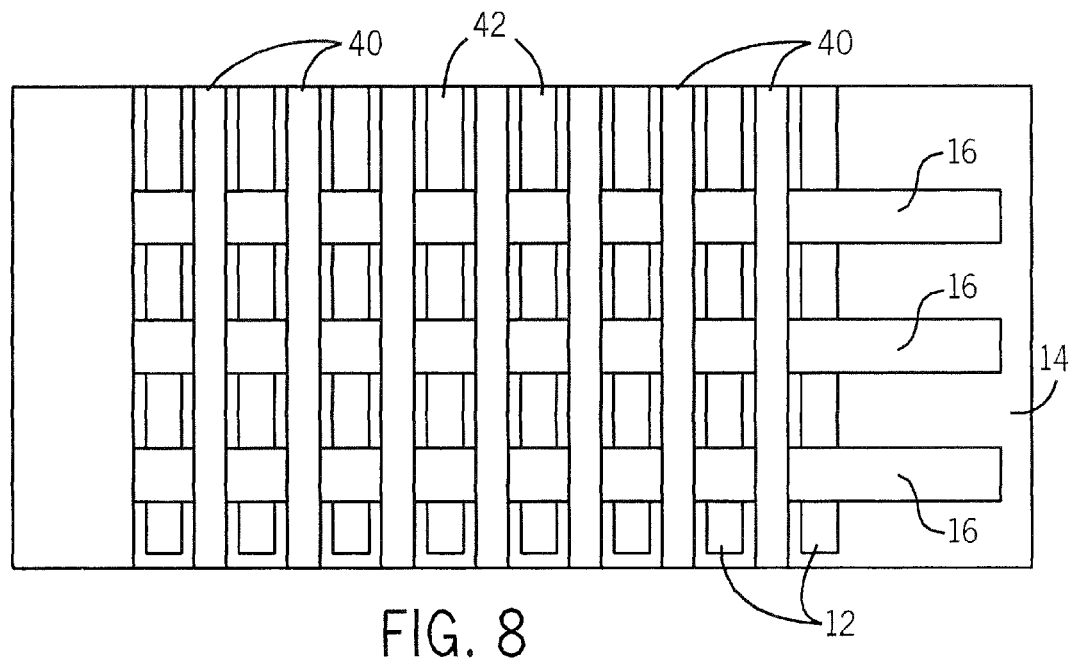
FIG. 8 is an enlarged top plan view of still another embodiment.

Of course, the same process may be done in the reverse order wherein the structure is first masked oil perpendicularly to the direction of the conductive lines 16 by forming masks 40 overlying the regions between adjacent active areas 12, as shown in FIG. 8. Dry etching may be used to form trenches 42 in the dielectric 14 between masks 40.

Figure 9:
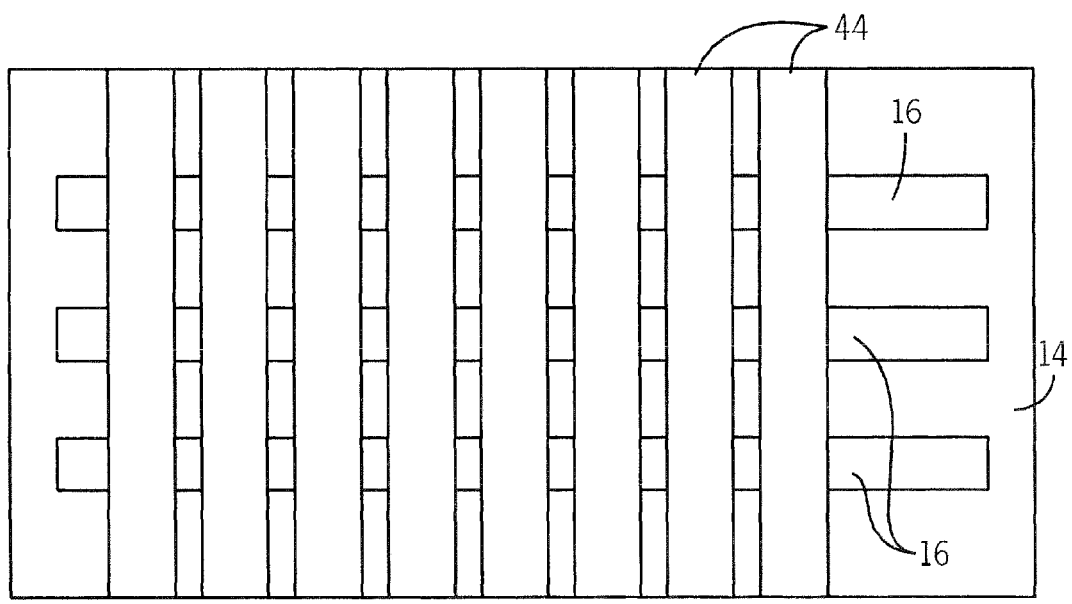
FIG. 9 is an enlarged top plan view at a subsequent stage.

The intervening trenches 42 may be trench filled, for example, by a suitable material 44, as shown in FIG. 9. Then the trench fill material 44 may be etched back to the height desired.

Figure 10:
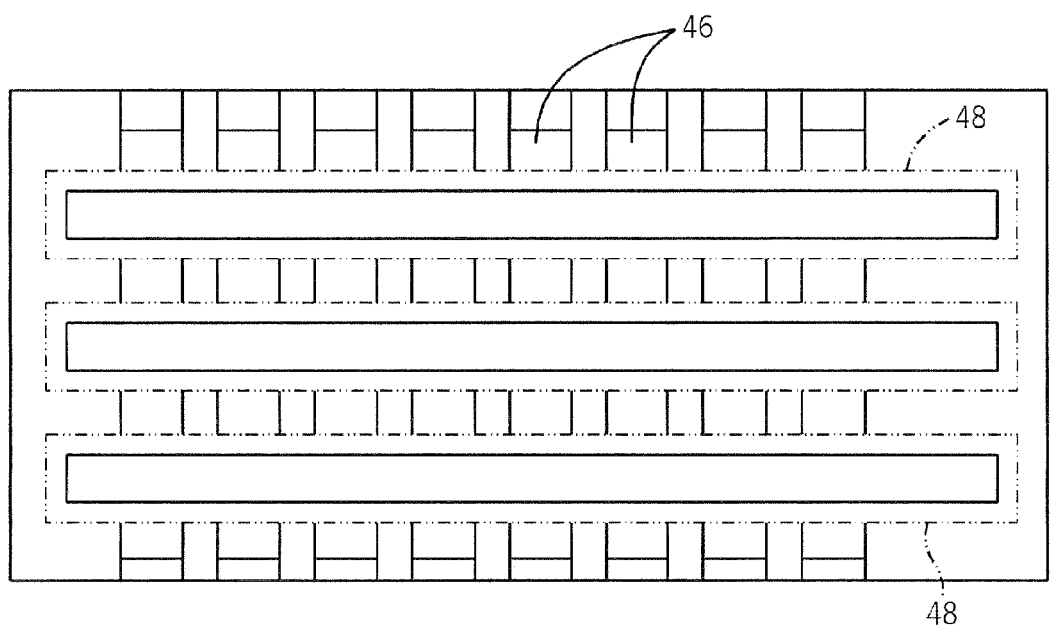
FIG. 10 is an enlarged top plan view at a subsequent stage.

Thereafter the array contacts 46 may be formed by etching out the filler material using masks 48 shown in FIG. 10. The contacts 46 are found at the intersections of two masks, as shown in FIG. 10, by metal filling, followed by chemical mechanical planarization.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed:

1. A method, comprising:
    filling parallel, spaced trenches formed through a dielectric layer with a filler material;
    forming a plurality of masks extending perpendicularly to the length of said filled trenches;
    etching the exposed portions of the filled trenches to form openings in the filled trenches; and
    filling the openings with a metal.

2. The method of claim 1, further comprising removing the plurality of masks.

3. The method of claim 1, further comprising:
    etching an upper portion of the metal; and
    etching an upper portion of the filled trenches.

4. The method of claim 3, further comprising forming array contacts coupled to a metal line.

5. The method of claim 4, wherein the array contacts include the openings with the metal.

6. The method of claim 4, further comprising forming the metal line and the array contacts in the same metallization.

7. The method of claim 1, further comprising forming array contacts and metal lines in a dual damascene process.

8. The method of claim 1, further comprising forming parallel spaced active areas and forming the trenches parallel to the active areas.

9. The method of claim 8, wherein the parallel spaced active areas are formed below the trenches.

10. The method of claim 1, further comprising forming parallel spaced active areas and forming said trenches perpendicular to the active areas.

11. A method comprising:
    forming a plurality of parallel spaced filled trenches in a dielectric material formed over a memory array;
    forming a plurality of spaced openings along the length of each of the trenches of the plurality of parallel spaced filled trenches; and
    filling the plurality of spaced openings with a metal to form array contacts.

12. The method of claim 11, further comprising forming a plurality of parallel spaced masks extending transversely to the plurality of parallel spaced filled trenches prior to forming a plurality of spaced openings along the length of each of the trenches of the plurality of parallel spaced filled trenches.

13. The method of claim 11, further comprising etching an upper portion of the plurality of parallel spaced filled trenches.

14. The method of claim 13, further comprising forming metal lines in the upper portion of the plurality of parallel spaced filled trenches.

15. The method of claim 11, further comprising forming array contacts of metal lines in a dual damascene process.

16. The method of claim 11, further comprising:
    forming parallel spaced active areas; and
    forming the plurality of parallel spaced filled trenches perpendicular to the parallel spaced active areas.

17. The method of claim 16, wherein the parallel spaced active areas are formed below the plurality of parallel spaced filled trenches.

18. An apparatus, comprising:
    a memory array;
    a dielectric material over said memory array;

a filled trench in said dielectric material;
an opening along the length of the filled trench; and
an array contact formed in the opening.

19. The device of claim 18, wherein the dielectric material comprises a pre-metal deposition oxide.

20. The device of claim 18, further comprising an etch stop layer over the memory array below the dielectric material.

21. The device of claim 20, wherein the etch stop layer comprises a borderless nitride.

* * * * *